United States Patent
Weekly et al.

(10) Patent No.: US 8,399,981 B2
(45) Date of Patent: Mar. 19, 2013

(54) BALL GRID ARRAY WITH IMPROVED SINGLE-ENDED AND DIFFERENTIAL SIGNAL PERFORMANCE

(75) Inventors: Roger D. Weekly, Austin, TX (US); Yaping Zhou, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/614,102

(22) Filed: Sep. 13, 2012

(65) Prior Publication Data

US 2013/0015573 A1    Jan. 17, 2013

Related U.S. Application Data

(63) Continuation of application No. 12/827,693, filed on Jun. 30, 2010.

(51) Int. Cl.
*H01L 23/48* (2006.01)
(52) U.S. Cl. .......... 257/697; 257/E23.015; 257/E23.168
(58) Field of Classification Search ................... 257/697
See application file for complete search history.

(56) References Cited

U.S. PATENT DOCUMENTS

| | | |
|---|---|---|
| 5,562,462 A | 10/1996 | Matsuba et al. |
| 5,952,726 A | 9/1999 | Liang |
| 6,727,597 B2 | 4/2004 | Taylor et al. |
| 6,768,206 B2 | 7/2004 | Hosomi |
| 6,870,273 B2 | 3/2005 | Tao et al. |
| 7,442,054 B2 | 10/2008 | Lemke et al. |
| 7,514,789 B1 | 4/2009 | Tao et al. |
| 7,538,431 B2 | 5/2009 | Isa et al. |
| 2003/0227093 A1 | 12/2003 | Hsu |

OTHER PUBLICATIONS

Rui Shi et al, "Efficient escape routing for hexagonal array of high density I/Os Full text," Presented at the Annual ACM IEEE Design Automation Conference, Proceedings of the 43rd annual Design Automation Conference, San Francisco, CA, USA, Session: Session 56: beyond-the-die circuit and system integration, pp. 1003-1008 , Year of Publication: 2006.

*Primary Examiner* — Steven Loke
*Assistant Examiner* — Kimberly M Thomas
(74) *Attorney, Agent, or Firm* — Hamilton & Terriile, LLP; Stephen A. Terrile

(57) ABSTRACT

An improved system and method for assigning power and ground pins and single ended or differential signal pairs for a ball grid array semiconductor package. In certain embodiments, the system uses a hexagonal pattern where the grid may be represented by a multiplicity of nested hexagonal patterns.

5 Claims, 20 Drawing Sheets

BALL GRID ARRAY WITH IMPROVED SINGLE-ENDED AND DIFFERENTIAL SIGNAL PERFORMANCE

This application is a continuation of co-pending application Ser. No. 12/827,693 filed Jun. 30, 2010, which is incorporated herein by reference in its entirety.

BACKGROUND OF THE INVENTION

1. Field of the Invention

Embodiments of the disclosure relate in general to the field of integrated circuits and, more particularly, to improved electrical connectors for integrated circuit packages comprising ball grid arrays or land grid arrays.

2. Description of the Related Art

A ball grid array (BGA) or land grid array (LGA) package offers a number of advantages relative to other, older package types, e.g., quad flat pack (QFP) and pin grid array (PGA), including small size, high input/output (I/O) pin count, improved electrical performance, low profiles, and good yields. These packages can be constructed with a substrate that can be either single or multi-layer. Substrates are fabricated with plastic or ceramic material, electrically conductive traces, and with planes being formed on a surface of each layer of the substrate. The surface of the substrate opposite from the semiconductor die or integrated circuit (IC) contains a plurality of solder balls that are soldered to the pads on a printed circuit board (PCB), thus attaching the package to the board. The semiconductor die is electrically connected to the substrate by either flip-chip (solder bump) interconnect or wire bonding. In both instances, the die is also generally encapsulated by plastic to protect it from the external environment.

One of the benefits of BGA packaging is the increase of achievable I/O densities compared to older package options. Since BGA packaging places contacts over the entire surface of the chip instead of just around the edges, IC designers can place more I/Os in a given package size while using relatively looser tolerance compared to older peripheral lead types. This offers additional benefits to board designers who are not subsequently constrained to use the fine pitches that are typically necessary for older high-lead count packages.

BGA packaging brings new challenges to the packaging designers, particularly in high-speed IC applications, where the effects of electromagnetic interference (EMI) become extremely important, and BGA I/O densities exacerbate this problem. Signal integrity is another important issue for packages and boards emerging from high-speed transceivers in high-end FPGAs and ICs. Impedance control is critical for package-to-board transitions connecting signals from layer to layer.

In view of the foregoing, it would be desirable to provide a high-speed BGA semiconductor device having improved electromagnetic interference (EMI) and signal integrity characteristics. In particular, it would be desirable to provide a hexagonal ball-grid array having improved electrical performance.

BRIEF SUMMARY OF THE INVENTION

Embodiments of the present invention provide an improved system and method for assigning power and ground pins and single ended or differential signal pairs for a ball grid array semiconductor package. Various embodiments of the invention comprise: a) using a hexagonal pattern wherein the grid may be represented by a multiplicity of nested hexagonal patterns; b) for a 4 to 1 signal to power/ground pin ratio, a first horizontal row of pins consists of pins 1 through 8, and a second horizontal row of pins 9 through 15, where each pin in the second row is offset (substantially between two pins of the first row above) from the first, row whereby the pin assignment consists of pins 3, 8, 9, and 14 used as power/ground pins with the remainder used as signal pins; c) for a 3 to 1 signal to power/ground pin ratio, a first horizontal row of pins consist of pins 1 through 8 and a second horizontal row of pins 9 through 15, where each pin in the second row is offset (substantially between two pins of the first row above) from the first row, whereby the pin assignment consists of pins 1, 5, 11, and 15 used as power/ground pins with the remainder used as signal pins; and d) for a 2 to 1 signal to power/ground pin ratio, a first horizontal row of pins consists of pins 1 through 8 and a second horizontal row of pins 9 through 17, where each pin in the second row is offset (substantially between two pins of the first row above) from the first row, whereby the pin assignment consists of pins 1, 4, 7, 11, 14, and 17 used as power/ground pins, with the remainder used as signal pins.

The above, as well as additional purposes, features, and advantages of the present invention will become apparent in the following detailed written description.

BRIEF DESCRIPTION OF THE DRAWINGS

Selected embodiments of the present invention may be understood, and its numerous objects, features and advantages obtained, when the following detailed description is considered in conjunction with the following drawings, in which.

DETAILED DESCRIPTION

A system and method for improving single-ended and differential signal performance in integrated circuits comprising ball grid arrays is disclosed herein. As will be appreciated by one skilled in the art, the present invention may be embodied as a system or a method.

Embodiments of the invention are described below with reference to flowchart illustrations and/or block diagrams of methods, apparatus (systems) and computer program products according to embodiments of the invention.

Figure 1:
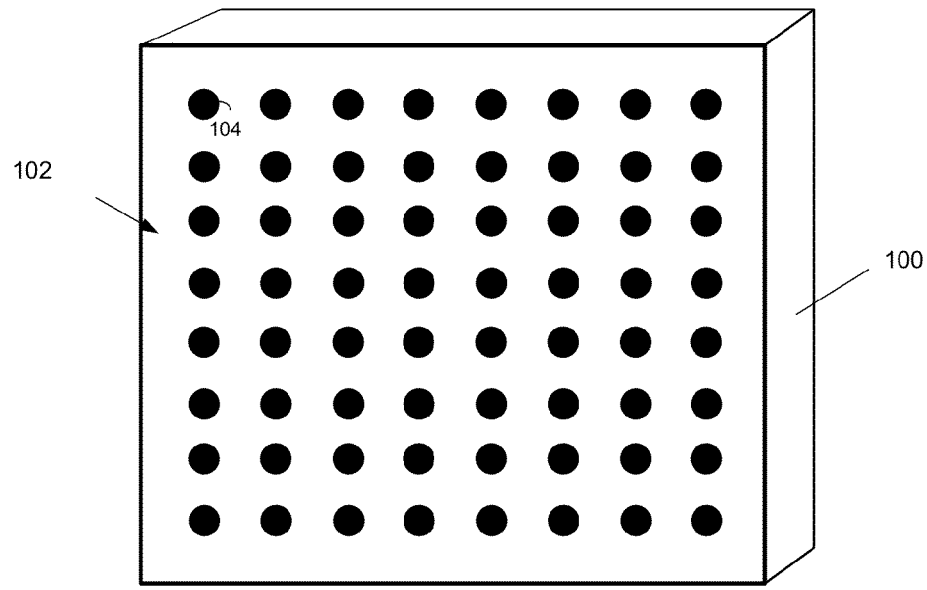
FIG. 1 is an illustration of a prior art ball grid array, wherein the individual connectors are arranged in a square grid array.

FIG. 1 is an illustration of a prior art ball grid array, wherein the individual connectors are arranged in a square grid array on the outer surface of an integrated circuit 100. The ball grid array comprises a plurality of individual connectors 104 arranged in a plurality of rows and columns. In most prior art systems, the connection arrays between integrated circuits and the package and the connection arrays between the packages and boards have been configured using square grid arrays such as that shown in FIG. 1. Many historical design optimizations that have been implemented to increase electrical performance are based on square grid arrays such as the one shown in FIG. 1.

Figure 2:
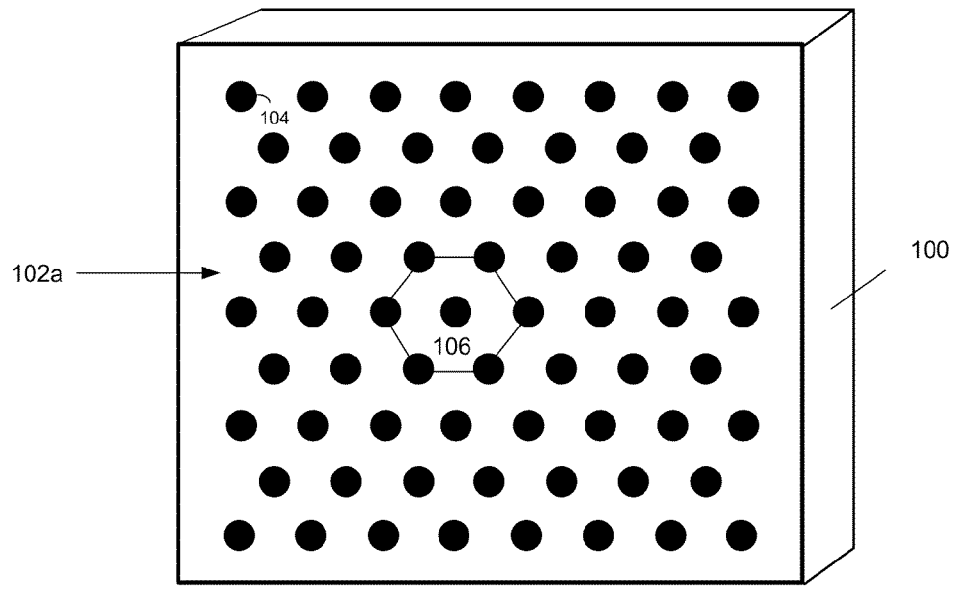
FIG. 2 is an illustration of a prior art ball grid array, wherein the individual connectors are arranged in a hexagonal pattern.

FIG. 2 is an illustration of a prior art ball grid array, wherein the individual connectors are arranged in a hexagonal pattern on the outer surface of an integrated circuit 100. The ball grid array comprises a plurality of individual connectors 104 arranged in a plurality of rows and columns, with the individual rows being offset laterally such that individual balls in one row are offset by approximately one half the distance between individual balls in the adjacent row. As can be seen in FIG. 2, the individual connectors in the array are arranged in a hexagonal pattern as illustrated by reference numeral 112. As will be understood by those of skill in the art, hexagonal ball grid arrays make it possible to increase the density of individual signal connectors by approximately 16%. The efficiencies associated with hexagonal ball grid arrays are described in "Efficient Escape Routing for Hexagonal Arrays of Higher Density I/Os," Rui Shi and Chung-Kuan Cheng, Annual ACM IEEE Design Conference Proceedings, which by this reference is incorporated herein for all purposes.

Figure 3:
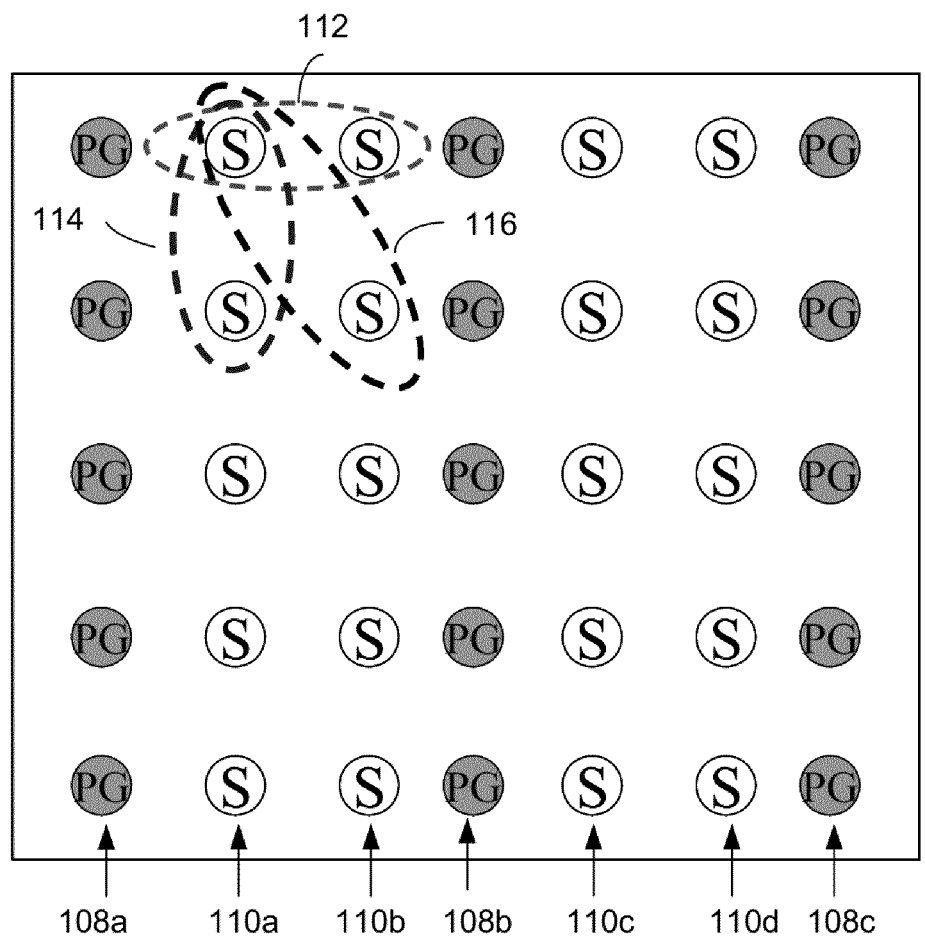
FIG. 3 is an illustration of possible configurations for assigning power and ground pins and also various ways to assign differential signal pairs in a ball grid array.

FIG. 3 is an illustration of possible configurations for assigning power and ground pins and also is an illustration of various ways to assign differential signal pairs in a ball grid array. The array shown in FIG. 3 comprises a plurality of rows of power/ground connectors 108a-c and a plurality of rows of signal connectors 110a-d. The individual signal connectors can be paired "transversely," i.e., along an axis that is transverse to the longitudinal axis of an adjacent row of power/ground connectors, as illustrated by reference numeral 112. Alternatively, the individual signal connectors can be paired "longitudinally," i.e., along the longitudinal axis of the row of power/ground connectors, as illustrated by reference numeral 114. The individual signal connectors can also be paired "diagonally," as illustrated by reference numeral 116. As will be illustrated hereinbelow, the choice of the pairing configuration for pairs of signal connectors can result in significantly different electrical performance.

Various embodiments for configurations of hexagonal arrays with different signal-to-power/ground ratios, e.g., 1:1, 2:1, 3:1, and 4:1 will be discussed hereinbelow. In the analysis of BSM assignments, the Lself is calculated for the various connectors. The mutual inductance from all other signals is also calculated and summed to calculate Lmutual. Since vias usually have an impedance that is lower than the target value, a higher Lself means that a higher impedance is preferred. However, it is difficult to assess the impact of Lself and, therefore, Lself is listed for informational purposes. Lmutual is used for comparison. When vias of different lengths are compared, for the first-order effect, Lmutual can be assumed to be linearly proportional to the via length.

Figure 4:
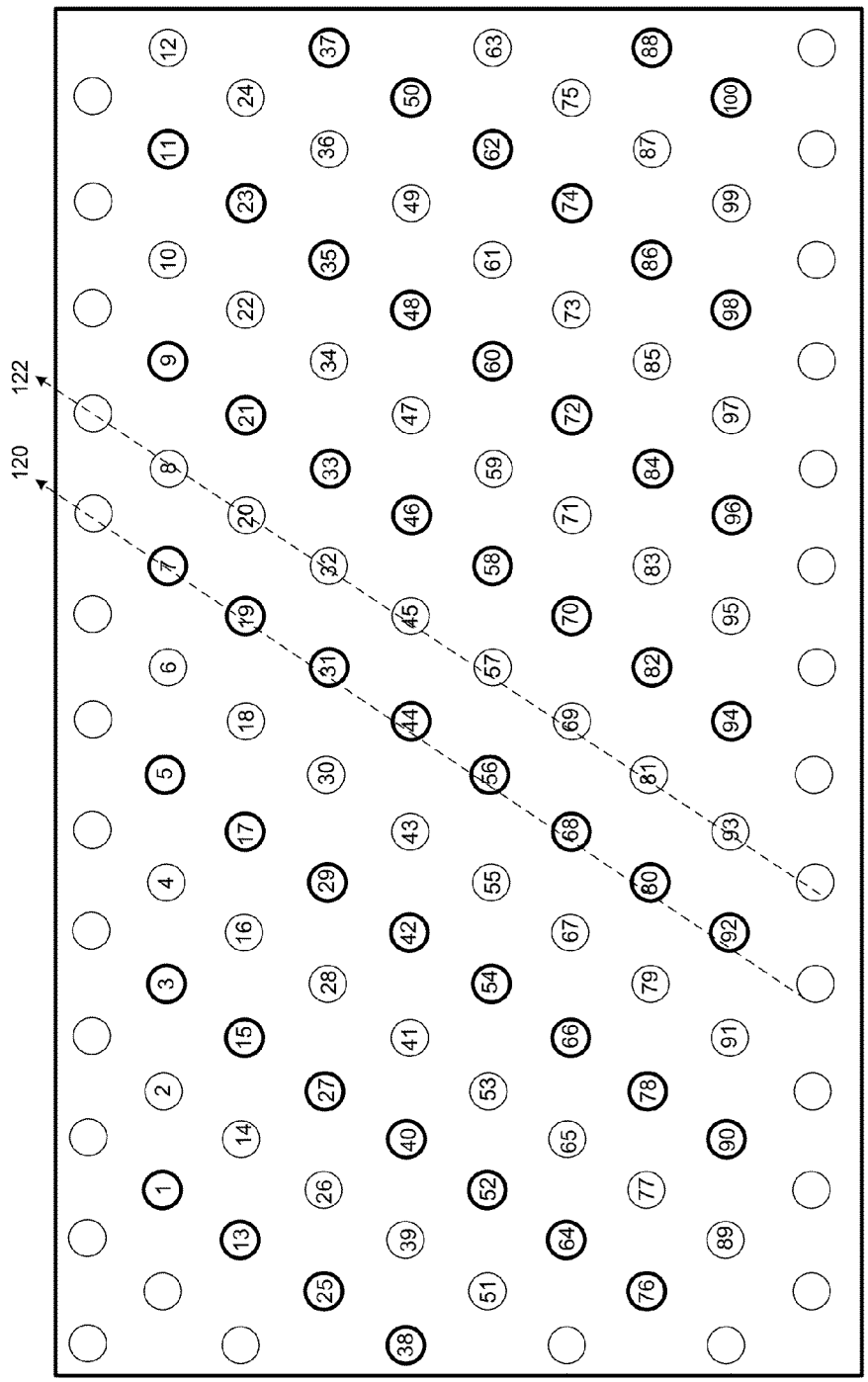
FIG. 4 is an illustration of a first embodiment for arranging power/ground connectors and signal connectors in a single-ended hexagonal 1:1 ball grid array.

FIG. 4 is an illustration of a first embodiment for arranging power/ground connectors and signal connectors in a single-ended hexagonal 1:1 ball grid array. In this embodiment, the power/ground connectors and the individual signal connectors are arranged in interleaved rows, wherein a single signal connector is surrounded on each side laterally by a power/ground connector. In this embodiment, the individual power/ground connectors are arranged in diagonal rows as illustrated by reference numeral 120 and the individual signal connectors are arranged in diagonal rows as illustrated by reference numeral 122.

Figure 5:
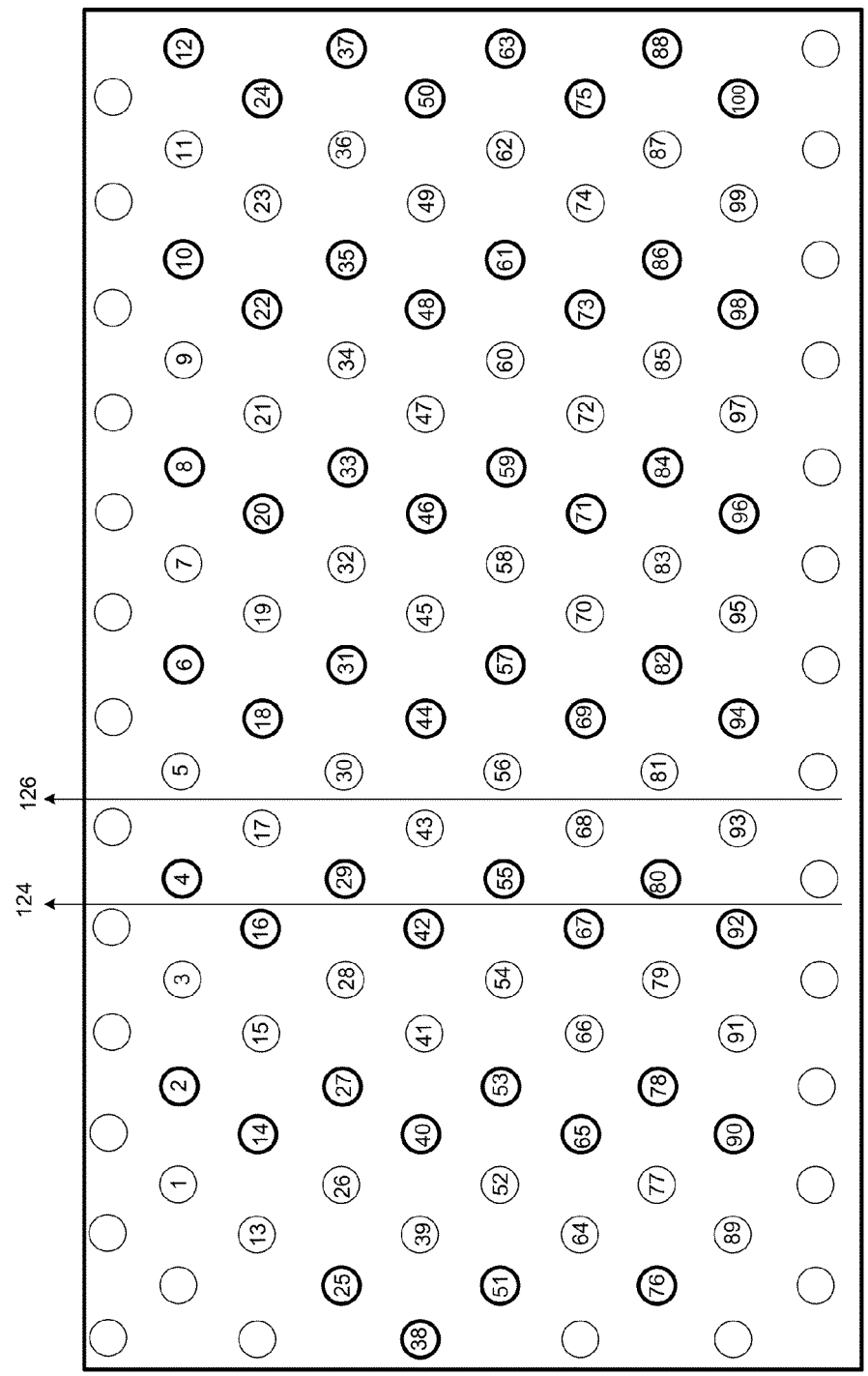
FIG. 5 is an illustration of a second embodiment for arranging power/ground connectors and signal connectors in a single-ended hexagonal 1:1 ball grid array.

FIG. 5 is an illustration of a second embodiment for arranging power/ground connectors and signal connectors in a single-ended hexagonal 1:1 ball grid array. In this embodiment, the power/ground connectors and the individual signal connectors are again arranged in interleaved rows, wherein a single signal connector is surrounded on each side laterally by a power/ground connector. However, the power/ground connectors are configured in zigzagged rows as illustrated by reference numeral 124, and the individual signal connectors are likewise configured in zigzagged rows as illustrated by reference number 126.

Table 1 is a comparison of the Lself and Lmutual for the configurations shown in FIGS. 4 and 5:

TABLE 1

|  | Lself | | Lmutual | |
| --- | --- | --- | --- | --- |
|  | Max | Min | Max | Min |
| FIG. 4 | 0.950 | 0.950 | 0.414 | 0.414 |
| FIG. 5 | 0.950 | 0.950 | 0.429 | 0.429 |

Figure 6:
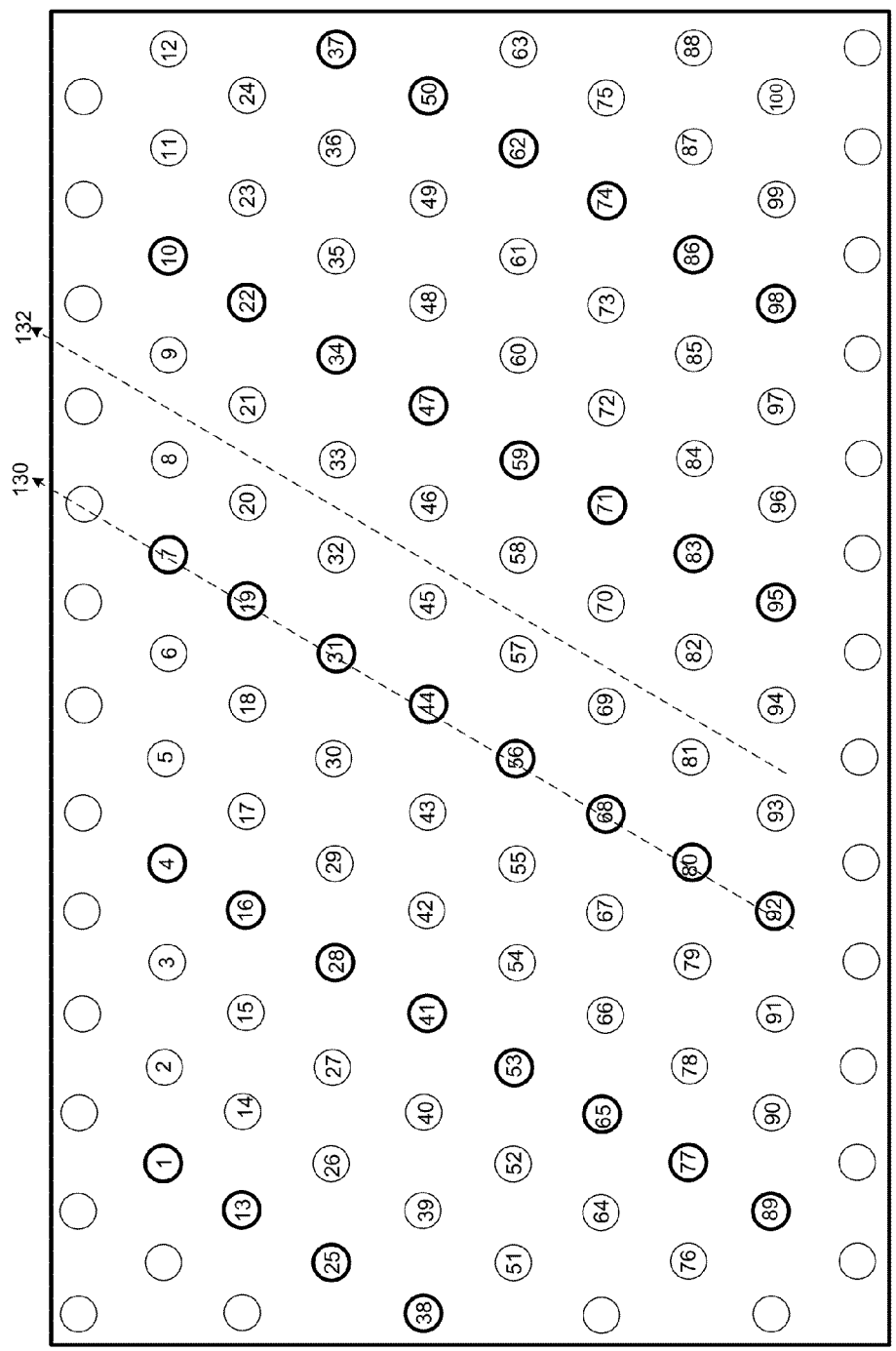
FIG. 6 is an illustration of a first embodiment for arranging power/ground connectors and signal connectors in a single-ended hexagonal 2:1 ball grid array.

FIG. 6 is an illustration of a first embodiment for arranging power/ground connectors and signal connectors in a single-ended hexagonal 2:1 ball grid array. In this embodiment, the power/ground connectors and the individual signal connectors are arranged in interleaved rows, wherein a pair of signal connectors is surrounded on each side laterally by a power/ground connector. In this embodiment, the individual power/ground connectors are arranged in diagonal rows as illustrated by reference numeral 130, and the pairs of signal connectors are arranged in diagonal rows as illustrated by reference numeral 132.

Figure 7:
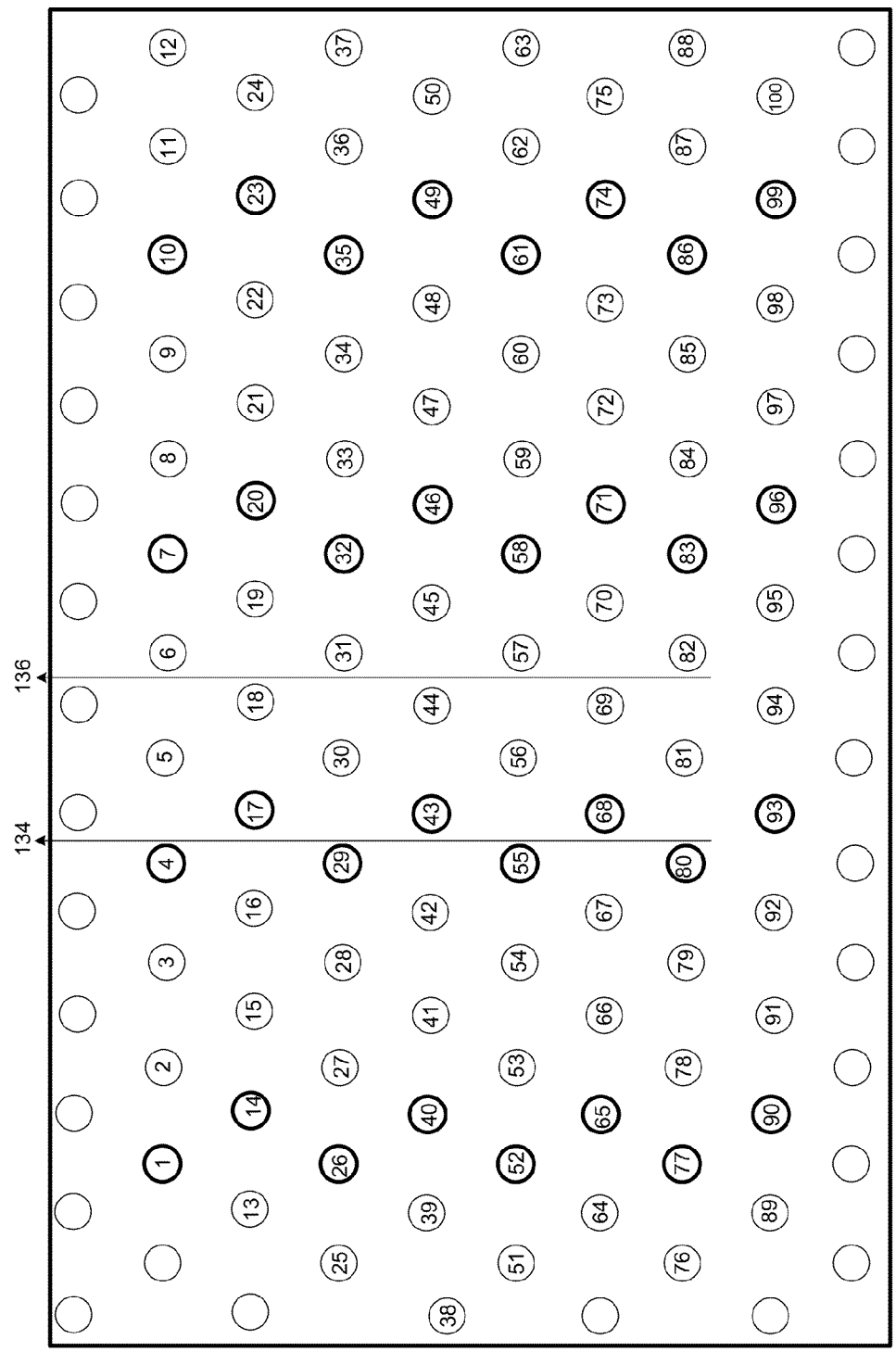
FIG. 7 is an illustration of a second embodiment for arranging power/ground connectors and signal connectors in a single-ended hexagonal 2:1 ball grid array.

FIG. 7 is an illustration of a second embodiment for arranging power/ground connectors and signal connectors in a single-ended hexagonal 2:1 ball grid array. In this embodiment, the power/ground connectors and the individual signal connectors are again arranged in interleaved rows, wherein a pair of signal connectors is surrounded on each side laterally by a power/ground connector. However, the power/ground connectors are configured in zigzagged rows as illustrated by reference numeral 134, and the pairs of signal connectors are likewise configured in zigzagged rows as illustrated by reference number 136.

Figure 8:
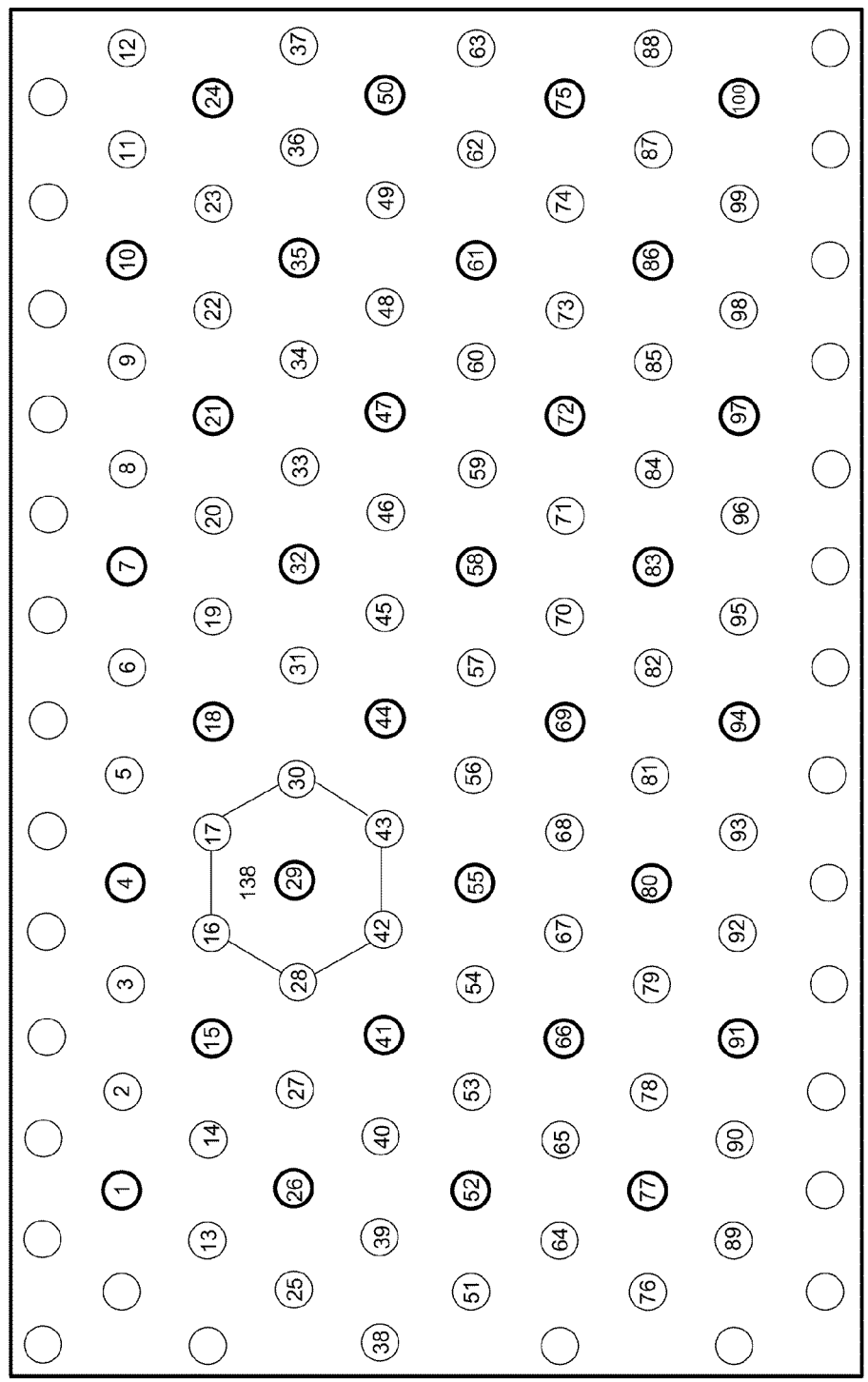
FIG. 8 is an illustration of a third embodiment for arranging power/ground connectors and signal connectors in a single-ended hexagonal 2:1 ball grid array.

FIG. 8 is an illustration of a third embodiment for arranging power/ground connectors and signal connectors in a single-ended hexagonal 2:1 ball grid array. In this embodiment, the power/ground connectors and the individual signal connectors are again arranged in interleaved rows, wherein a pair of signal connectors is surrounded on each side laterally by a power/ground connector. However, in this embodiment, the configuration of individual signal connectors and power/ground connectors results in a configuration wherein each power/ground connector is disposed in the center of a group of hexagonally configured signal connectors as illustrated by reference numeral 138.

Table 2 is a comparison of the Lself and Lmutual for the configurations shown in FIGS. 6, 7 and 8:

TABLE 2

|  | Lself | | Lmutual | |
| --- | --- | --- | --- | --- |
|  | Max | Min | Max | Min |
| FIG. 6 | 1.062 | 1.062 | 1.589 | 1.589 |
| FIG. 7 | 1.115 | 1.024 | 2.013 | 1.478 |
| FIG. 8 | 0.983 | 0.983 | 0.900 | 0.900 |

As can be seen from the data in Table 2, the configuration shown in FIG. 8 provides significantly lower Lself and Lmutual than the configurations shown in FIGS. 6 and 7.

Figure 9:
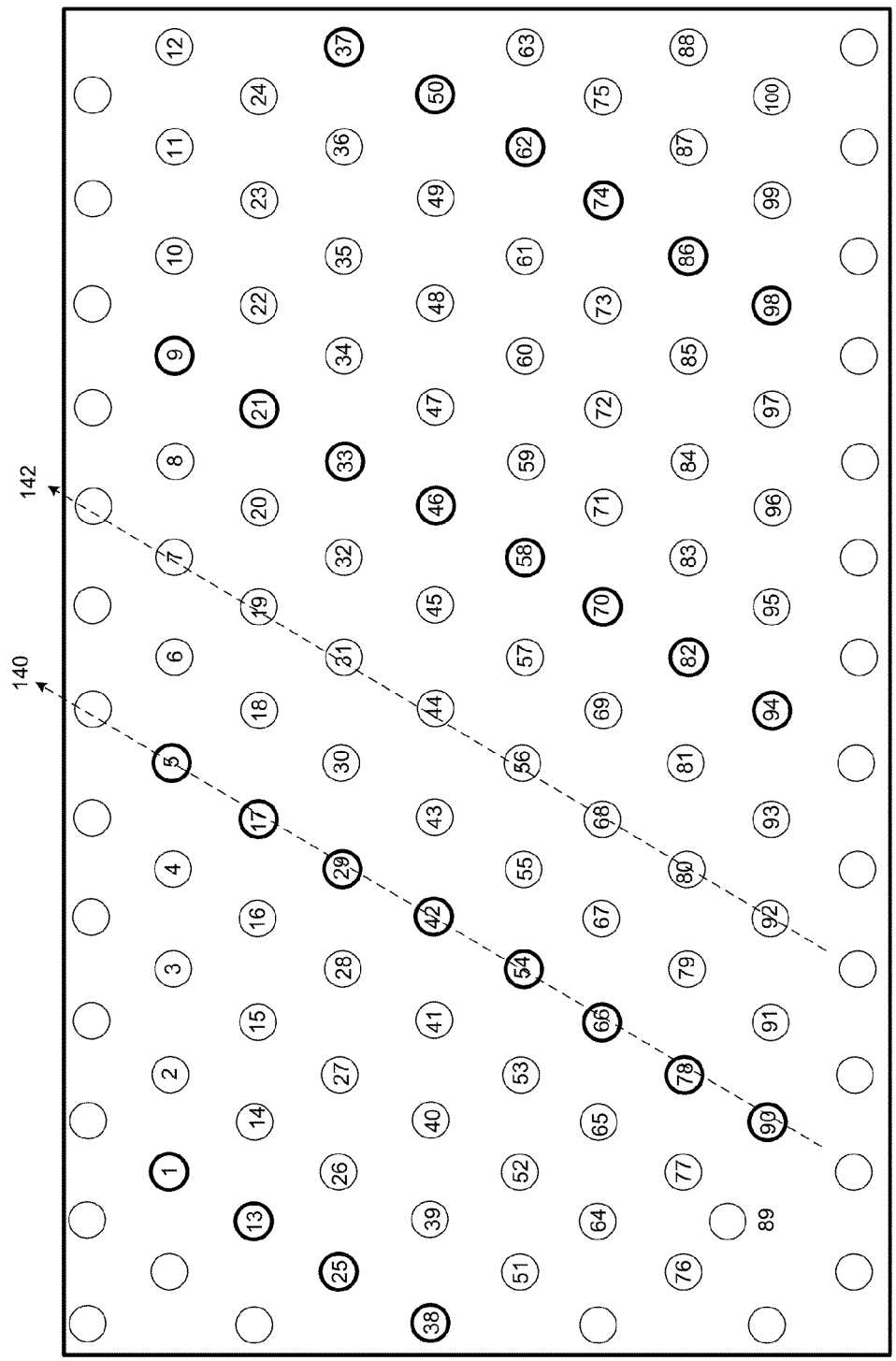
FIG. 9 is an illustration of a first embodiment for arranging power/ground connectors and signal connectors in a single-ended hexagonal 3:1 ball grid array.

FIG. 9 is an illustration of a first embodiment for arranging power/ground connectors and signal connectors in a single-ended hexagonal 3:1 ball grid array. In this embodiment, the power/ground connectors and the individual signal connectors are arranged in interleaved rows, wherein three signal connectors are surrounded on each side laterally by a power/ground connector. In this embodiment, the individual power/ground connectors are arranged in diagonal rows as illustrated by reference numeral 140 and the groups of three signal connectors are arranged in diagonal rows as illustrated by reference numeral 142.

Figure 10:
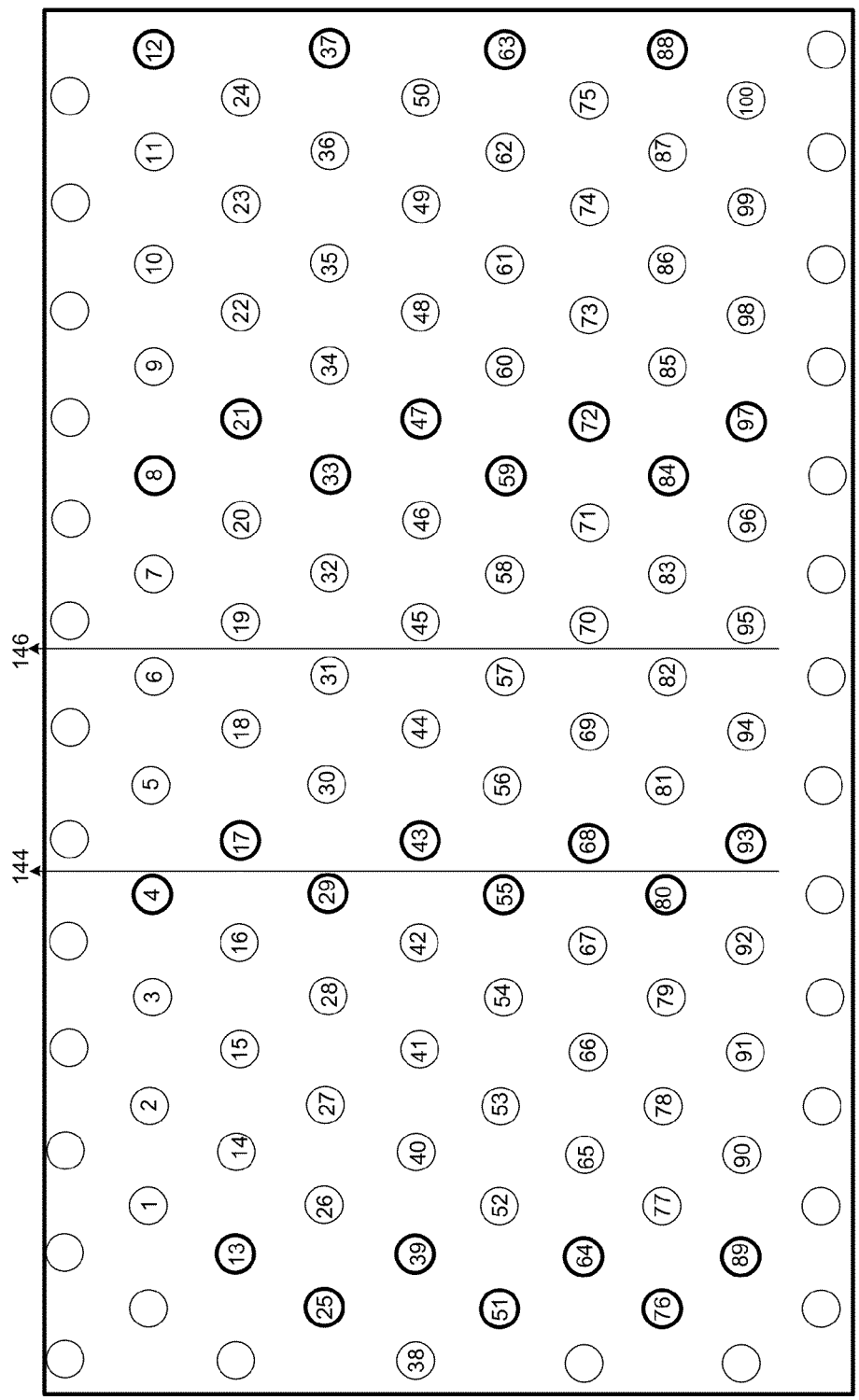
FIG. 10 is an illustration of a second embodiment for arranging power/ground connectors and signal connectors in a single-ended hexagonal 3:1 ball grid array.

FIG. 10 is an illustration of a second embodiment for arranging power/ground connectors and signal connectors in a single-ended hexagonal 3:1 ball grid array. In this embodiment, the power/ground connectors and the individual signal connectors are again arranged in interleaved rows, wherein a group of three signal connectors is surrounded on each side laterally by a power/ground connector. The power/ground connectors are configured in zigzagged rows as illustrated by reference numeral 144, and the groups of three connectors are likewise configured in zigzagged rows as illustrated by reference number 146.

Figure 11:
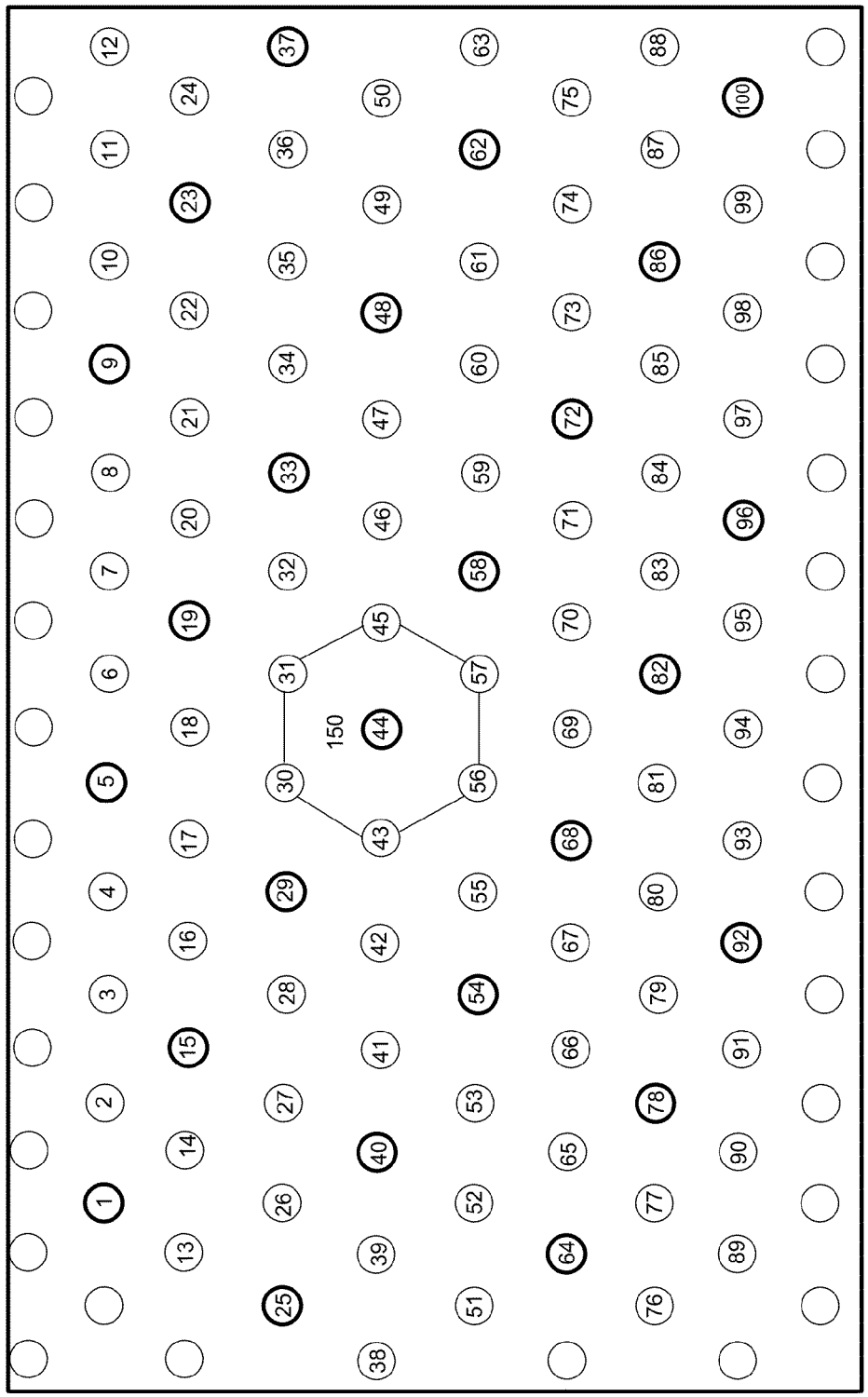
FIG. 11 is an illustration of a third embodiment for arranging power/ground connectors and signal connectors in a single-ended hexagonal 3:1 ball grid array.

FIG. 11 is an illustration of a third embodiment for arranging power/ground connectors and signal connectors in a single-ended hexagonal 3:1 ball grid array. In this embodiment, the power/ground connectors and the individual signal connectors are again arranged in interleaved rows, wherein a group of three signal connectors are surrounded on each side laterally by a power/ground connector. In this embodiment, the configuration of individual signal connectors and power/ground connectors again results in a configuration wherein each power/ground connector is disposed in the center of a group of hexagonally configured signal connectors as illustrated by reference numeral 150.

Table 3 is a comparison of the Lself and Lmutual for the configurations shown in FIGS. 9, 10 and 11:

TABLE 3

|  | Lself | | Lmutual | |
| --- | --- | --- | --- | --- |
|  | Max | Min | Max | Min |
| FIG. 9 | 1.248 | 1.102 | 3.900 | 2.835 |
| FIG. 10 | 1.273 | 1.046 | 4.465 | 2.470 |
| FIG. 11 | 1.047 | 1.043 | 1.729 | 1.045 |

As can be seen from the data in Table 3, the configuration shown in FIG. 11 provides significantly lower Lself and Lmutual than the configurations shown in FIGS. 9 and 10.

Figure 12:
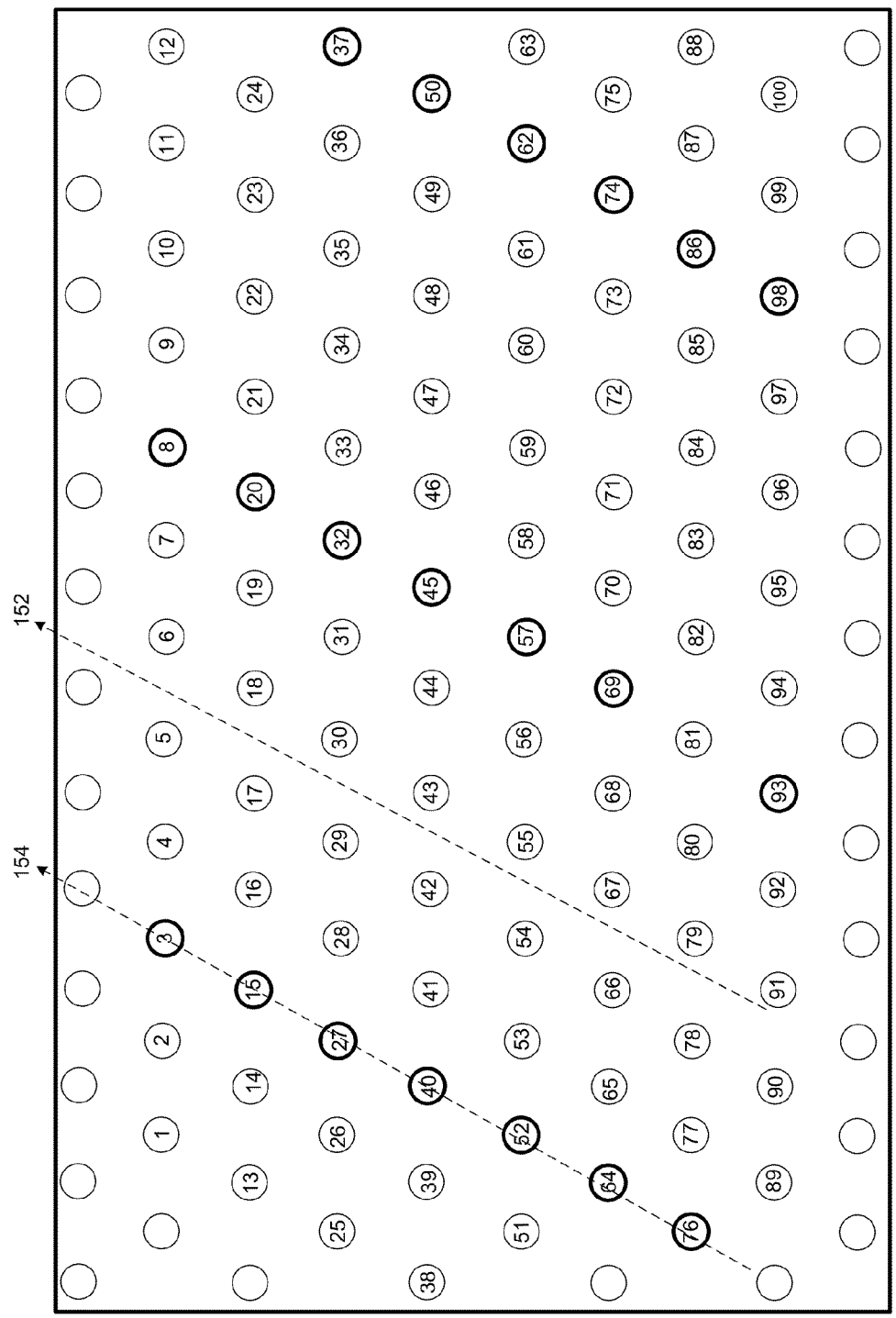
FIG. 12 is an illustration of a first embodiment for arranging power/ground connectors and signal connectors in a single-ended hexagonal 4:1 ball grid array.

FIG. 12 is an illustration of a first embodiment for arranging power/ground connectors and signal connectors in a single-ended hexagonal 4:1 ball grid array. In this embodiment, the power/ground connectors and the individual signal connectors are arranged in interleaved rows wherein four signal connectors are surrounded on each side laterally by a power/ground connector. In this embodiment, the individual power/ground connectors are arranged in diagonal rows as illustrated by reference numeral 152, and the groups of four signal connectors are arranged in diagonal rows as illustrated by reference numeral 154.

Figure 13:
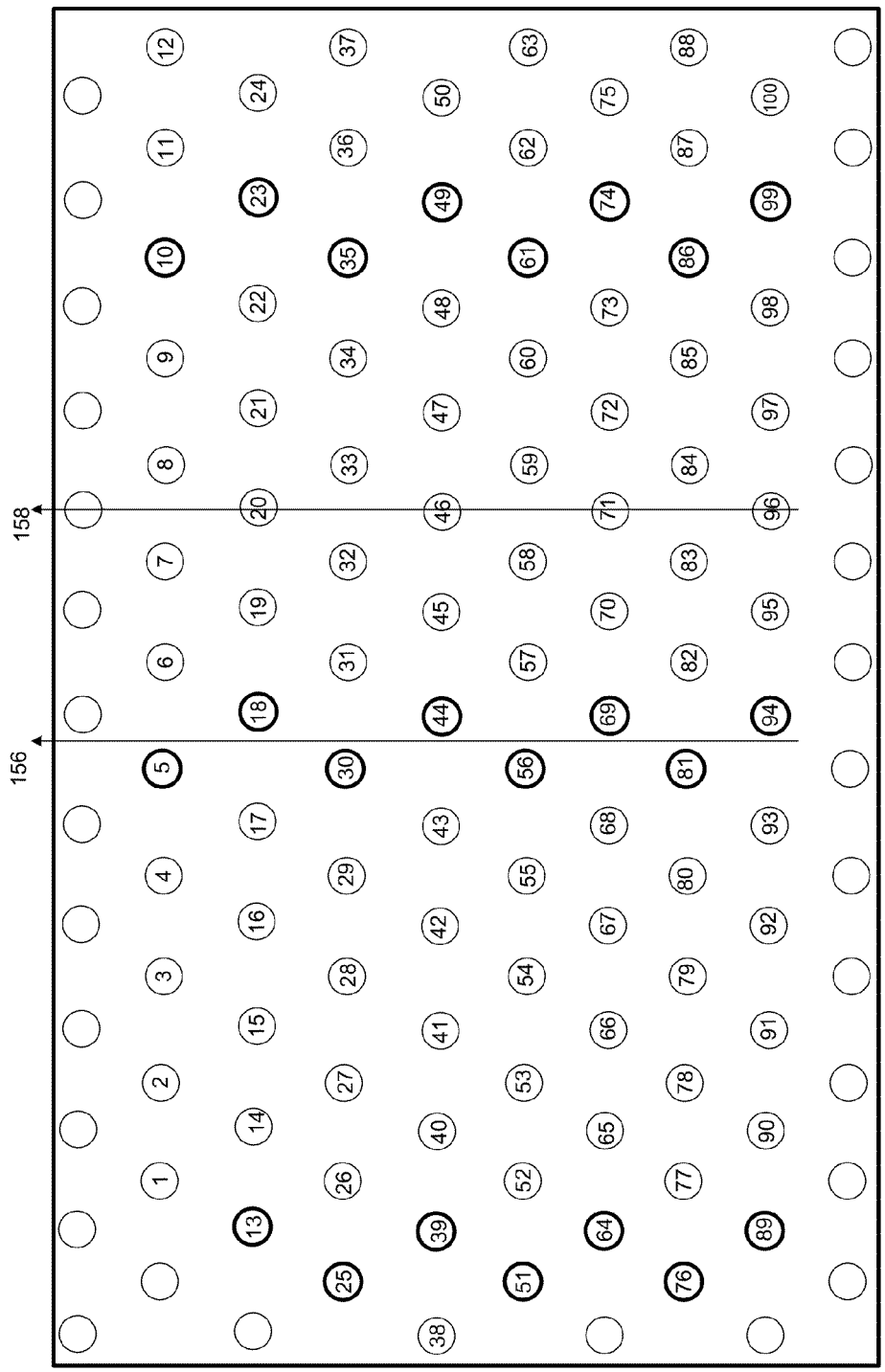
FIG. 13 is an illustration of a second embodiment for arranging power/ground connectors and signal connectors in a single-ended hexagonal 4:1 ball grid array.

FIG. 13 is an illustration of a second embodiment for arranging power/ground connectors and signal connectors in a single-ended hexagonal 4:1 ball grid array. In this embodiment, the power/ground connectors and the individual signal connectors are again arranged in interleaved rows, wherein a group of four signal connectors are surrounded on each side laterally by a power/ground connector. The power/ground connectors are configured in zigzagged rows as illustrated by reference numeral 144, and the groups of four connectors are likewise configured in zigzagged rows as illustrated by reference number 146.

Figure 14:
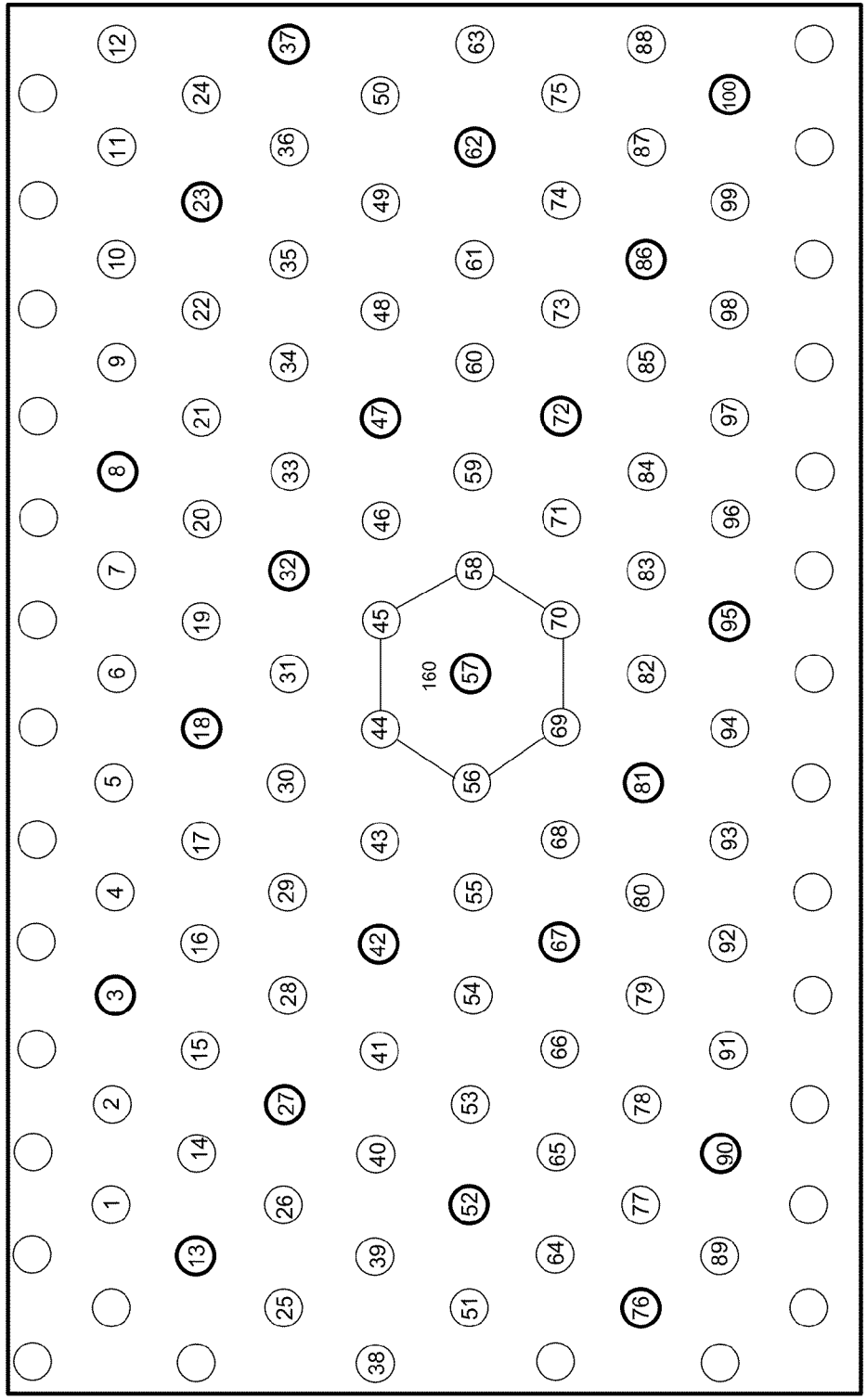
FIG. 14 is an illustration of a third embodiment for arranging power/ground connectors and signal connectors in a single-ended hexagonal 4:1 ball grid array.

FIG. 14 is an illustration of a third embodiment for arranging power/ground connectors and signal connectors in a single-ended hexagonal 4:1 ball grid array. In this embodiment, the power/ground connectors and the individual signal connectors are again arranged in interleaved rows, wherein a group of four signal connectors are surrounded on each side laterally by a power/ground connector. In this embodiment, the configuration of individual signal connectors and power/ground connectors again results in a configuration wherein each power/ground connector is disposed in the center of a group of hexagonally configured signal connectors, as illustrated by reference numeral 160.

Table 12 is a comparison of the Lself and Lmutual for the configurations shown in FIGS. 12, 13 and 14:

TABLE 4

|  | Lself | | Lmutual | |
| --- | --- | --- | --- | --- |
|  | Max | Min | Max | Min |
| FIG. 12 | 1.332 | 1.122 | 6.476 | 4.069 |
| FIG. 13 | 1.387 | 1.056 | 7.580 | 3.525 |
| FIG. 14 | 1.145 | 1.056 | 3.078 | 2.272 |

As can be seen from the data in Table 4, the configuration shown in FIG. 14 provides significantly lower Lself and Lmutual than the configurations shown in FIGS. 12 and 13.

Figure 15:
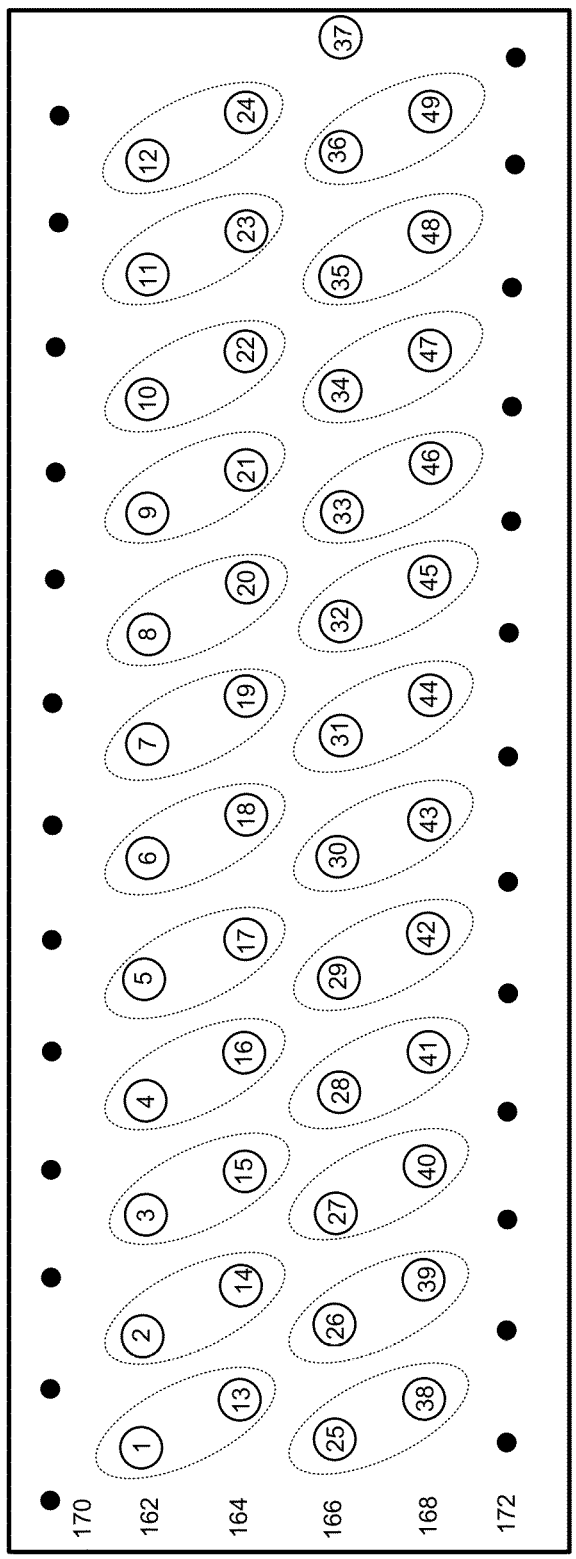
FIG. 15 is an illustration of a first embodiment for arranging power/ground connectors and differential signal connectors in a hexagonal 4:1 ball grid array.

FIG. 15 is an illustration of a first embodiment for arranging power/ground connectors and differential signal connectors in a hexagonal 4:1 ball grid array. The signal connectors in the embodiment shown in FIG. 15 are arranged in four rows 162, 164, 166, and 168, with the connectors in rows 164 and 168 offset from the corresponding connectors in rows 162 and 166 by approximately half the distance between the respective connectors. The connectors in rows 162 and 164 are diagonally paired with respect to the longitudinal axis of the power/ground connectors in row 170. Likewise, the connectors in rows 166 and 166 are diagonally paired with respect to the longitudinal axis of the power/ground connectors in row 172.

Figure 16:
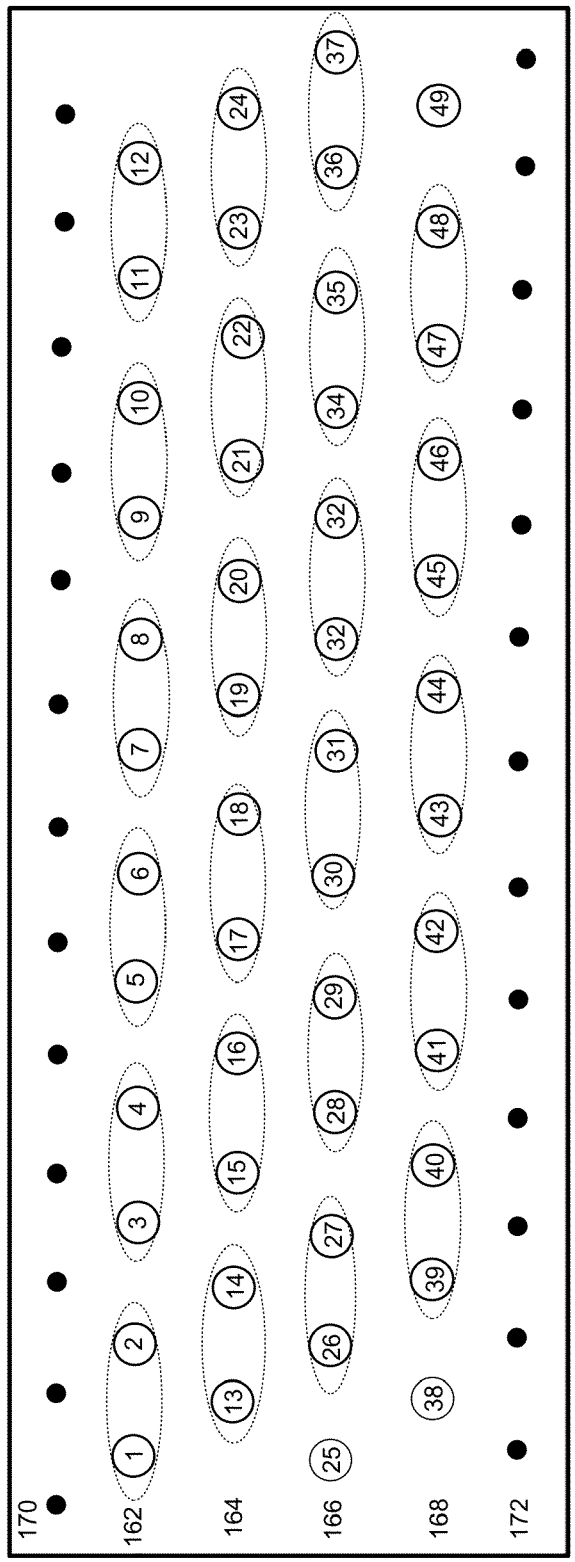
FIG. 16 is an illustration of a second embodiment for arranging power/ground connectors and differential signal connectors in a hexagonal 4:1 ball grid array.

FIG. 16 is an illustration of a second embodiment for arranging power/ground connectors and differential signal connectors in a hexagonal 4:1 ball grid array. In this embodiment, the signal connectors in rows 162, 164, 166, and 168 are paired with adjacent signal connectors in an orientation that is parallel to the longitudinal axis of the power connectors in rows 170 and 172.

Figure 17:
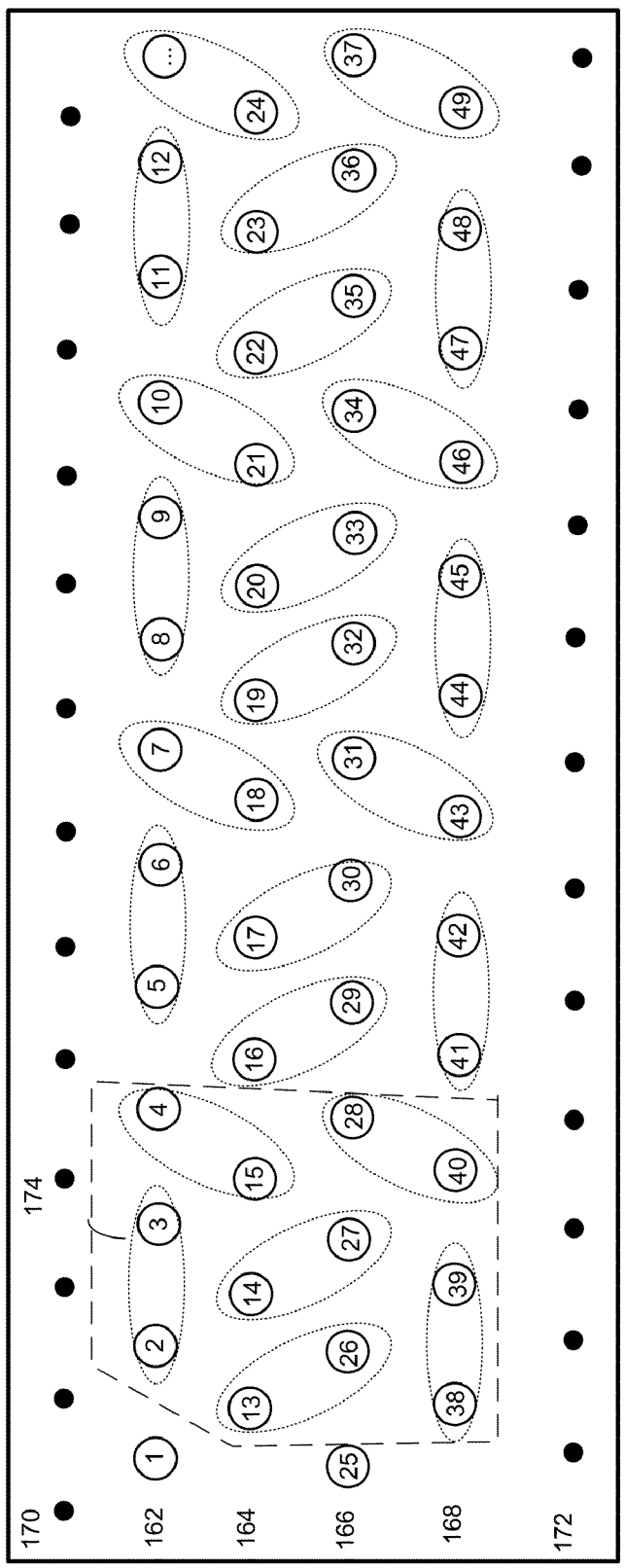
FIG. 17 is an illustration of a third embodiment for arranging power/ground connectors and differential signal connectors in a hexagonal 4:1 ball grid array.

FIG. 17 is an illustration of a third embodiment for arranging power/ground connectors and differential signal conductors in a hexagonal 4:1 ball grid array. In this configuration, the signal connectors are paired in a repeating pattern of the paired signal conductors identified by reference numeral 174. The pattern is comprised of first and second signal pairs adjacent to and arranged parallel to the longitudinal axis of the power/ground connectors in rows 170 and 172, respectively. The pattern also includes two sets of paired signal conductors comprising conductors in the inner rows 164 and 166, with these paired conductors being oriented diagonally with respect to the longitudinal axes of power/ground rows 170 and 172.

Figure 18:
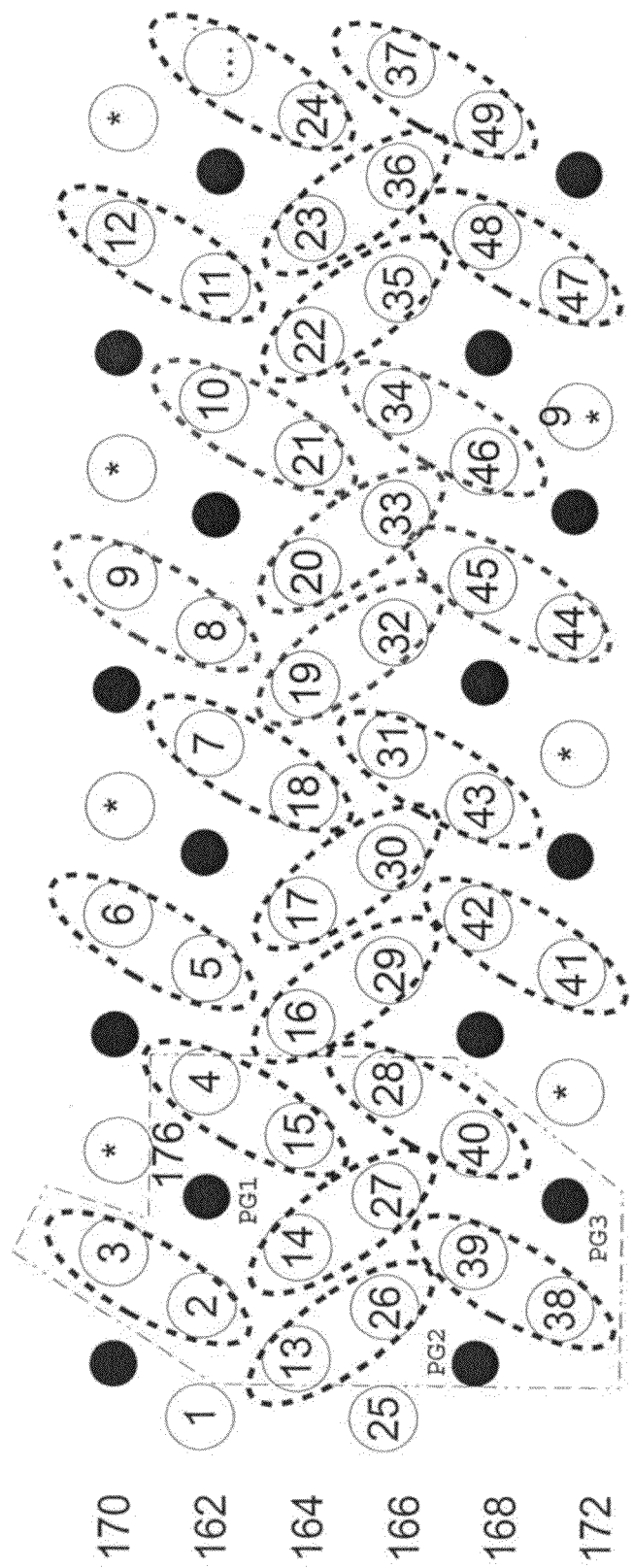
FIG. 18 is an illustration of a fourth embodiment for arranging power/ground connectors and differential signal connectors in a hexagonal 4:1 ball grid array.

FIG. 18 is an illustration of a fourth embodiment for arranging power/ground connectors and differential signal connectors in a hexagonal 4:1 ball grid array. In this configuration, the signal connectors are paired in a repeating pattern of the paired signal conductors identified by reference numeral 176. In this repeating pattern, first and second signal conductors, e.g., conductors 2 and 39, are paired with adjacent conductors 3 and 4 on power/ground rows 170 and 172, respectively. The pattern also includes two sets of paired signal conductors from the inner rows 164 and 166, e.g., paired conductors 13, 26 and 14, 27. These pairs are oriented diagonally with respect to the longitudinal axes of power/ground conductor rows 170 and 172. Finally, the pattern includes two sets of paired signal conductors, with each pair comprising one conductor from an outer row of conductors, e.g., conductors 4 and 40, and one conductor from an inner row of conductors, e.g., conductors 15 and 28, respectively. Each of these sets of paired conductors are oriented diagonally with respect to the longitudinal axis of the power/ground rows 170 and 172.

Figure 19:
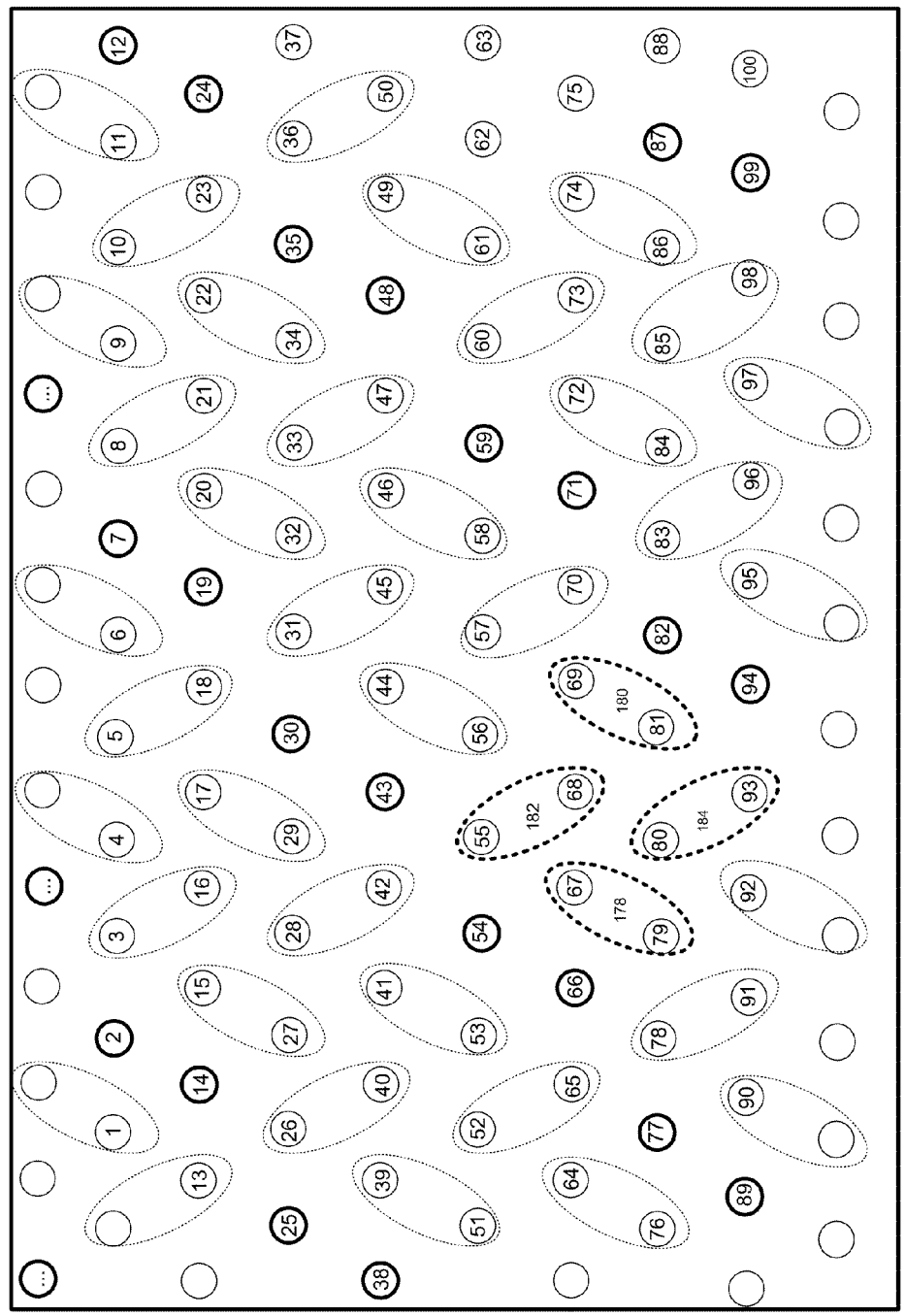
FIG. 19 is an illustration of a fifth embodiment for arranging power/ground connectors and differential signal connectors in a hexagonal 4:1 ball grid array.

FIG. 19 is an illustration of a fifth embodiment for arranging power/ground connectors and differential signal connectors in a hexagonal 4:1 ball grid array. The embodiment shown in FIG. 19 is comprised of a pattern of paired signal pairs illustrated generally by the signal conductor pairs 178, 180, 182, and 184. Signal conductor pairs 178 and 180 are comprised of signal conductors 67, 79 and 69, 81, respectively. Each of these signal conductor pairs are oriented parallel to adjacent power/ground pairs 54, 66 and 82, 94, respectively. The pattern also comprises two sets of signal pairs, 182 and 184 that are oriented perpendicular to pairs 178 and 180. Each of these sets of paired signal conductors comprises one signal conductor, e.g., 55, 93, that is adjacent to a power/ground conductor and one signal conductor, e.g., 68, 80, that is not adjacent to a power/ground conductor.

Figure 20:
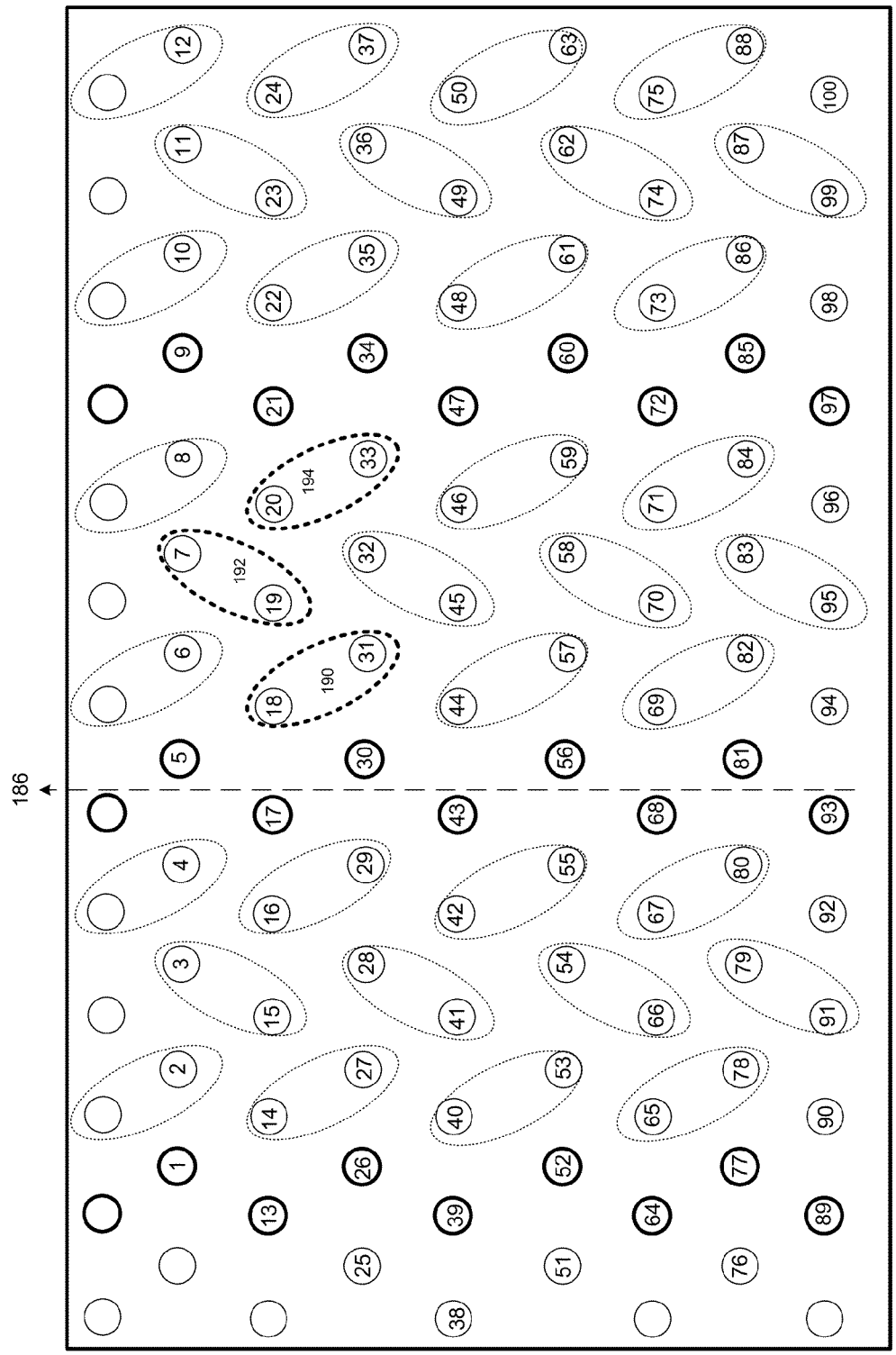
FIG. 20 is an illustration of an embodiment for arranging power/ground connectors and differential signal connectors in a hexagonal 3:1 ball grid array.

FIG. 20 is an illustration of a third embodiment for arranging power/ground connectors and differential signal connectors in a hexagonal 3:1 ball grid array. In this embodiment, the power/ground connectors and the individual signal connectors are again arranged in interleaved rows, wherein a group of three signal connectors is surrounded on each side laterally by a power/ground connector. The power/ground connectors and signal conductors on alternating rows are alternately staggered by one space left or right. The paired signal conductors are arranged in a pattern illustrated by paired signal conductors 190, 192, and 194. In paired signal conductors 190 and 194, each of the conductors 18, 33 are within one unit space from two power/ground conductors, e.g., 5, 30 or 21, 47. Each of those conductor pairs also has one signal conductor, e.g., conductor 20 or 31, that is within one unit space from one power conductor, e.g., conductor 21 or 30. Conductor pair 192 comprises one signal conductor, e.g., conductor 19, that is two spaces from the nearest conductor and another signal conductor, e.g., conductor 7, that is more than one unit space from the nearest conductor.

Figure 21:
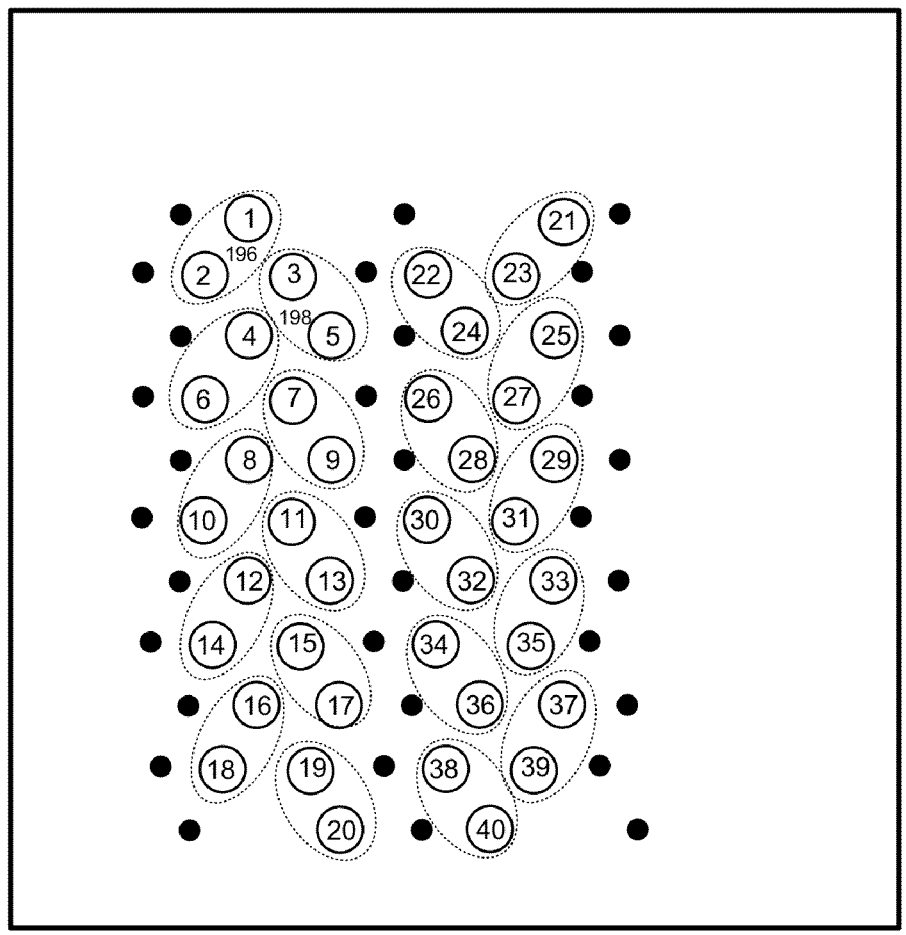
FIG. 21 is an illustration of an embodiment for arranging power/ground connectors and signal connectors in a single-ended hexagonal 2:1 ball grid array.

FIG. 21 is an illustration of a first embodiment for arranging power/ground connectors and signal connectors in a differential hexagonal 2:1 ball grid array. In this embodiment, the power/ground connectors and the individual signal connectors are again arranged in interleaved rows wherein a group of two signal connectors is surrounded on each side laterally by a power/ground connector. The power/ground connectors and signal connectors on alternating rows are alternately staggered by one space left or right. The paired signal conductors are arranged in a pattern illustrated by paired signal conductors 196 and 198. Each of the signal conductors 1, 2, 3, 5 in the respective sets of paired conductors is within one unit space of a power/ground conductor.

Tests conducted on the various configurations for power/ground connectors and differential signal connectors in hexagonal arrays as shown in FIGS. 15-21 indicated that the configurations shown in FIGS. 19, 20 and 21 provided very low relative coupling. For example the configuration for the 4:1 pairing configuration shown in FIG. 19 provided a relative coupling of 0.56; the 3:1 pairing configuration shown in FIG. 20 provided a relative coupling of 0.55 and the 2:1 pairing configuration shown in FIG. 21 provided a relative coupling of 0.36.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of skill in the art without departing from the scope and spirit of the invention. The embodiment was chosen and described in order to best explain the principles of the invention and the practical application, and to enable others of skill in the art to understand the invention for various embodiments with various modifications as are suited to the particular use contemplated.

Having thus described the invention of the present application in detail and by reference to preferred embodiments thereof, it will be apparent that modifications and variations are possible without departing from the scope of the invention defined in the appended claims.

What is claimed is:

1. An integrated circuit package comprising:
    a plurality of pins, the plurality of pins comprising
        a first pin, a second pin, a third pin, a fourth pin, a fifth pin, a sixth pin, each of the first, second, third, fourth, fifth, sixth, pins extending externally to the integrated circuit package, being linearly arranged in a first row and being equally spaced from each other;
        a seventh pin, an eighth pin, a ninth pin, a tenth pin, an eleventh pin, and a twelfth pin extending externally to the integrated circuit package, linearly arranged in a second row separated vertically from the first row and offset horizontally from the first row such that each pin in the second row is offset from the pins in the first row;
    wherein said first, fourth, seventh, and tenth pins comprise power/ground pins; and
    wherein the remaining pins are configured for use as signal pins.

2. The integrated circuit package of claim 1 wherein:
    an arrangement of the plurality of pins is repeated within the integrated circuit package;
    the arrangement of the plurality of pins provides equally spaced sets of the plurality of pins.

3. The integrated circuit package of claim 2 wherein:
    the arrangement of the plurality of pins provides power/ground pins positioned substantially diagonally across a plurality of rows.

4. The integrated circuit package of claim 3 wherein:
    the arrangement of the plurality of pins provides power/ground pins positioned substantially zigzagged across a plurality of rows.

5. The integrated circuit package of claim 3 wherein:
    the arrangement of the plurality of pins provides power/ground pins positioned such that each power/ground pin is disposed within a group of hexagonally configured signal pins.

* * * * *